(12) United States Patent
Wu et al.

(10) Patent No.: US 8,174,250 B2
(45) Date of Patent: May 8, 2012

(54) FIXED FREQUENCY RIPPLE REGULATOR

(75) Inventors: Wenkai Wu, East Greenwich, RI (US);
Ken Boyden, Thousand Oaks, CA (US);
Rami Hamze, Los Gatos, CA (US)

(73) Assignee: International Rectifier Corporation, El Segundo, CA (US)

( * ) Notice: Subject to any disclaimer, the term of this patent is extended or adjusted under 35 U.S.C. 154(b) by 547 days.

(21) Appl. No.: 12/246,148

(22) Filed: Oct. 6, 2008

(65) Prior Publication Data

US 2009/0174380 A1 Jul. 9, 2009

Related U.S. Application Data

(60) Provisional application No. 60/977,484, filed on Oct. 4, 2007.

(51) Int. Cl.
*G05F 1/59* (2006.01)
(52) U.S. Cl. .................. 323/271; 323/283; 323/288
(58) Field of Classification Search ............ 323/271, 323/282, 283, 288
See application file for complete search history.

(56) References Cited

U.S. PATENT DOCUMENTS

| | | | |
|---|---|---|---|
| 7,145,317 B1 * | 12/2006 | Shah | 323/288 |
| 2002/0125872 A1 * | 9/2002 | Groom et al. | 323/288 |
| 2003/0142519 A1 * | 7/2003 | Walters et al. | 363/89 |
| 2004/0070382 A1 * | 4/2004 | Walters et al. | 323/284 |
| 2004/0135563 A1 * | 7/2004 | Mihalka | 323/282 |
| 2004/0145927 A1 * | 7/2004 | Haase | 363/62 |
| 2005/0001597 A1 * | 1/2005 | Walters et al. | 323/222 |
| 2005/0007084 A1 * | 1/2005 | Xu et al. | 323/282 |
| 2005/0017703 A1 * | 1/2005 | Walters et al. | 323/288 |
| 2008/0042633 A1 * | 2/2008 | Klein | 323/288 |
| 2009/0009148 A1 * | 1/2009 | Philbrick | 323/282 |
| 2009/0140711 A1 * | 6/2009 | Philbrick et al. | 323/285 |
| 2009/0174380 A1 * | 7/2009 | Wu et al. | 323/282 |
| 2009/0237060 A1 * | 9/2009 | Schiff | 323/288 |
| 2010/0033153 A1 * | 2/2010 | Xing et al. | 323/288 |
| 2010/0102785 A1 * | 4/2010 | Young | 323/234 |
| 2010/0270995 A1 * | 10/2010 | Laur et al. | 323/285 |

* cited by examiner

*Primary Examiner* — Jeffrey Sterrett
(74) *Attorney, Agent, or Firm* — Farjami & Farjami LLP

(57) ABSTRACT

A ripple regulator for providing a pulse width modulation (PWM) signal for regulating an output voltage of a power converter switching stage. The regulator including a ripple circuit for providing a ripple voltage; a comparison circuit for comparing the ripple voltage to an output of an error amplifier; and a PWM circuit producing the PWM signal and receiving an output of the comparison circuit and a clock signal input, the clock signal input determining a first edge of the PWM signal and the output of said comparison circuit determining a second edge of the PWM signal.

10 Claims, 7 Drawing Sheets

Fixed Frequency Ripple Regulator

Synthetic Ripple Regulator

Fixed Frequency Ripple Regulator

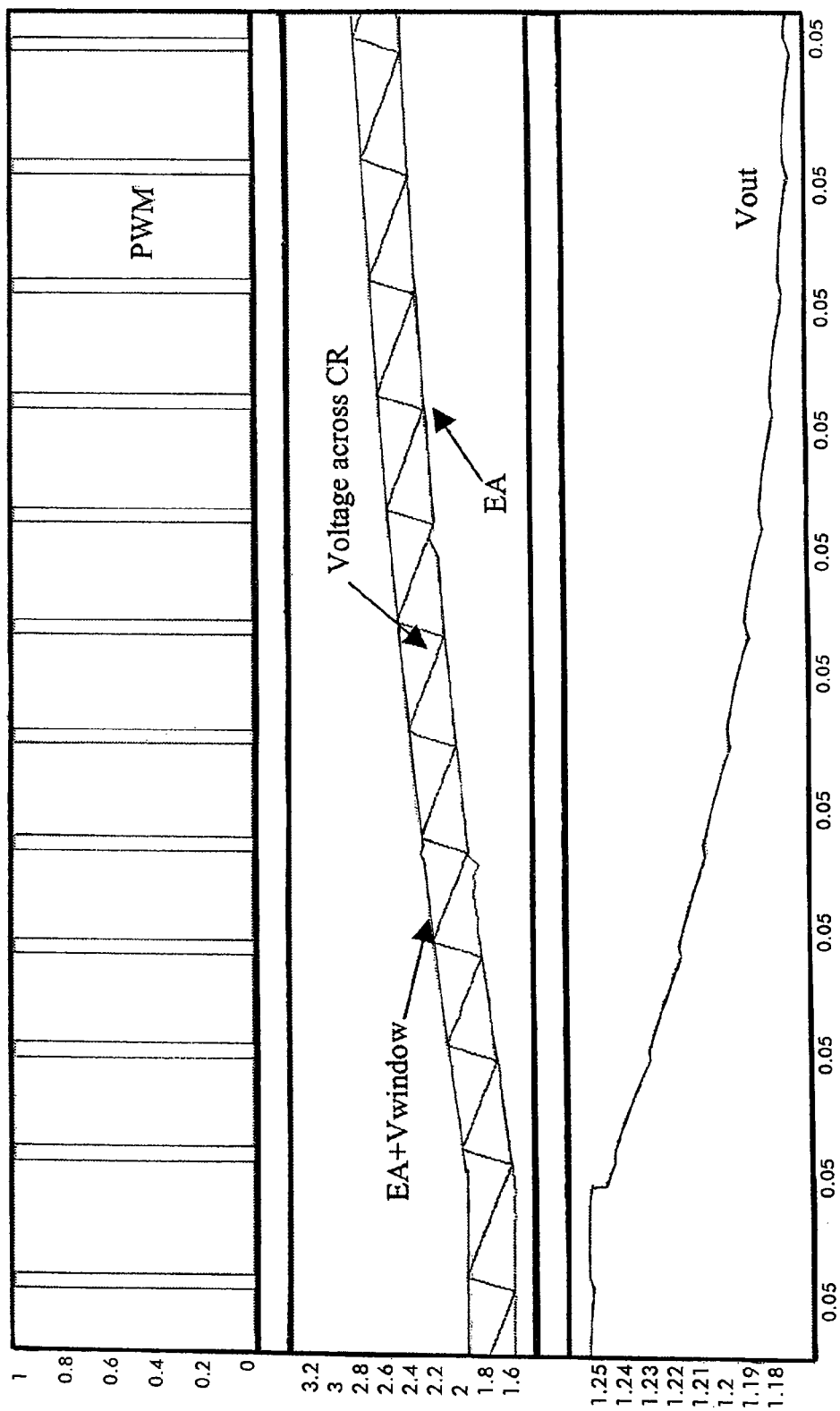
FIG. 3 (a) Load step-up
Simulation Results with Synthetic Ripple Regulator

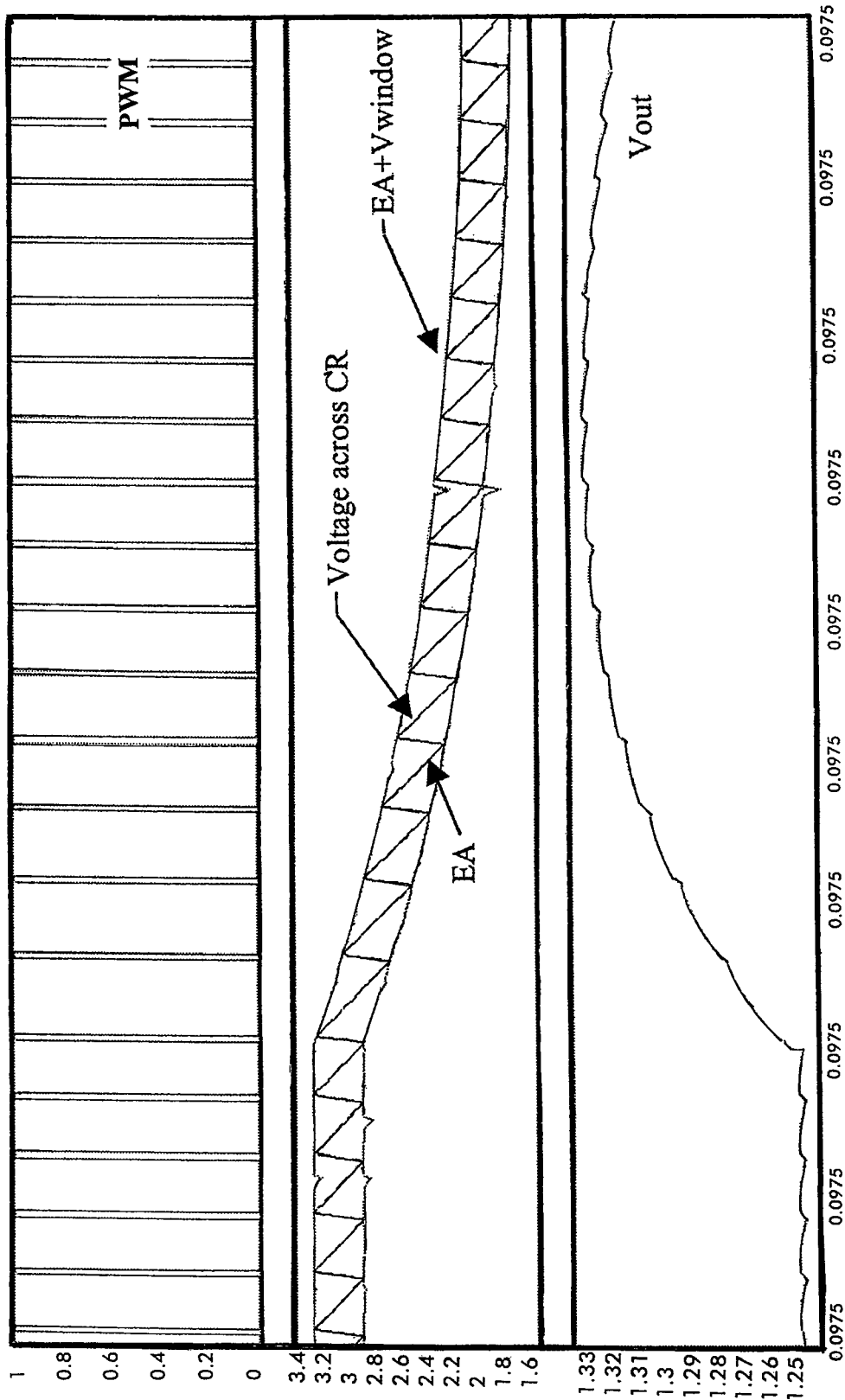
FIG. 3 (b) Load step-down

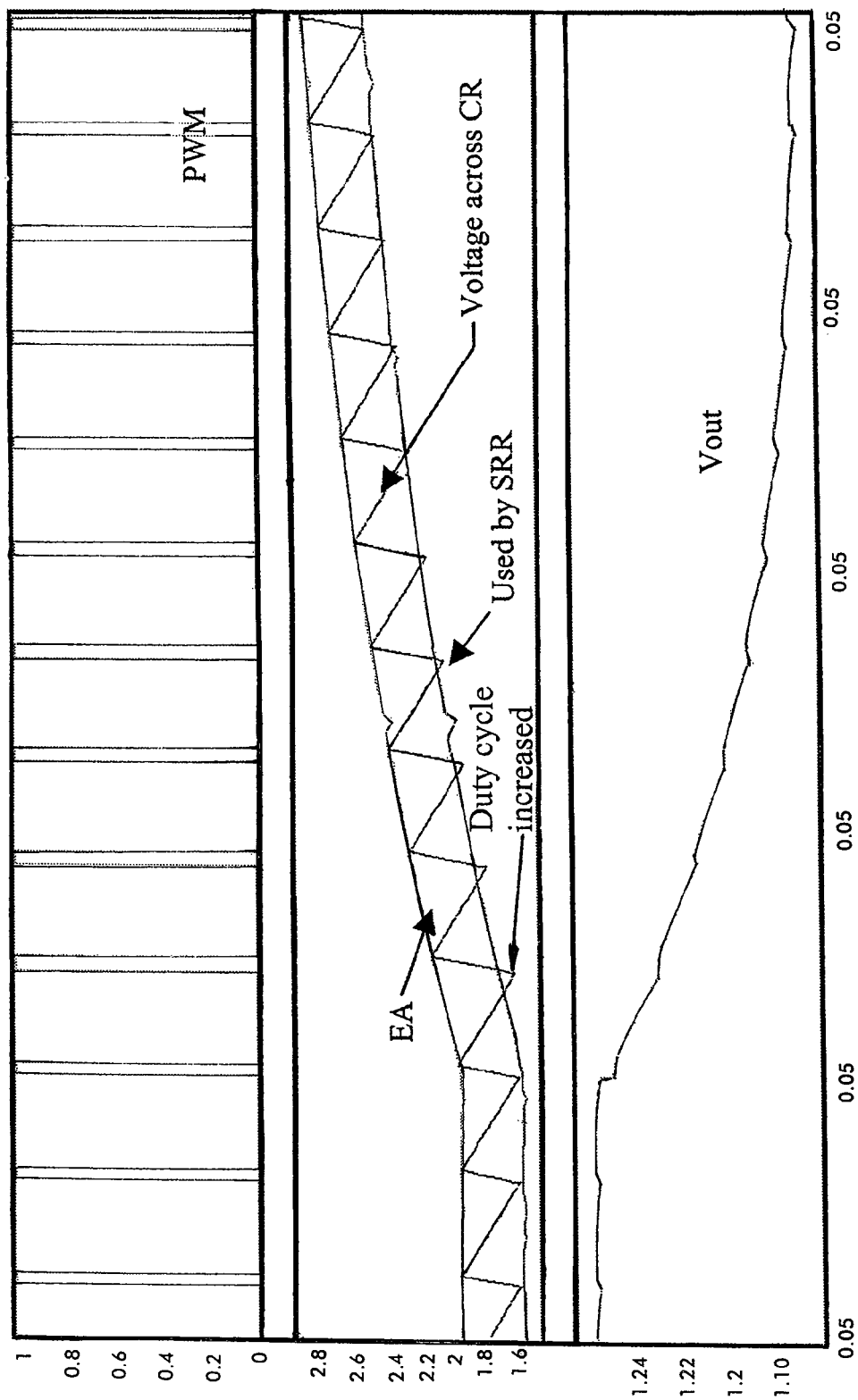
FIG. 4(a) Load step-up
Simulation Results with Fixed Frequency Ripple Regulator

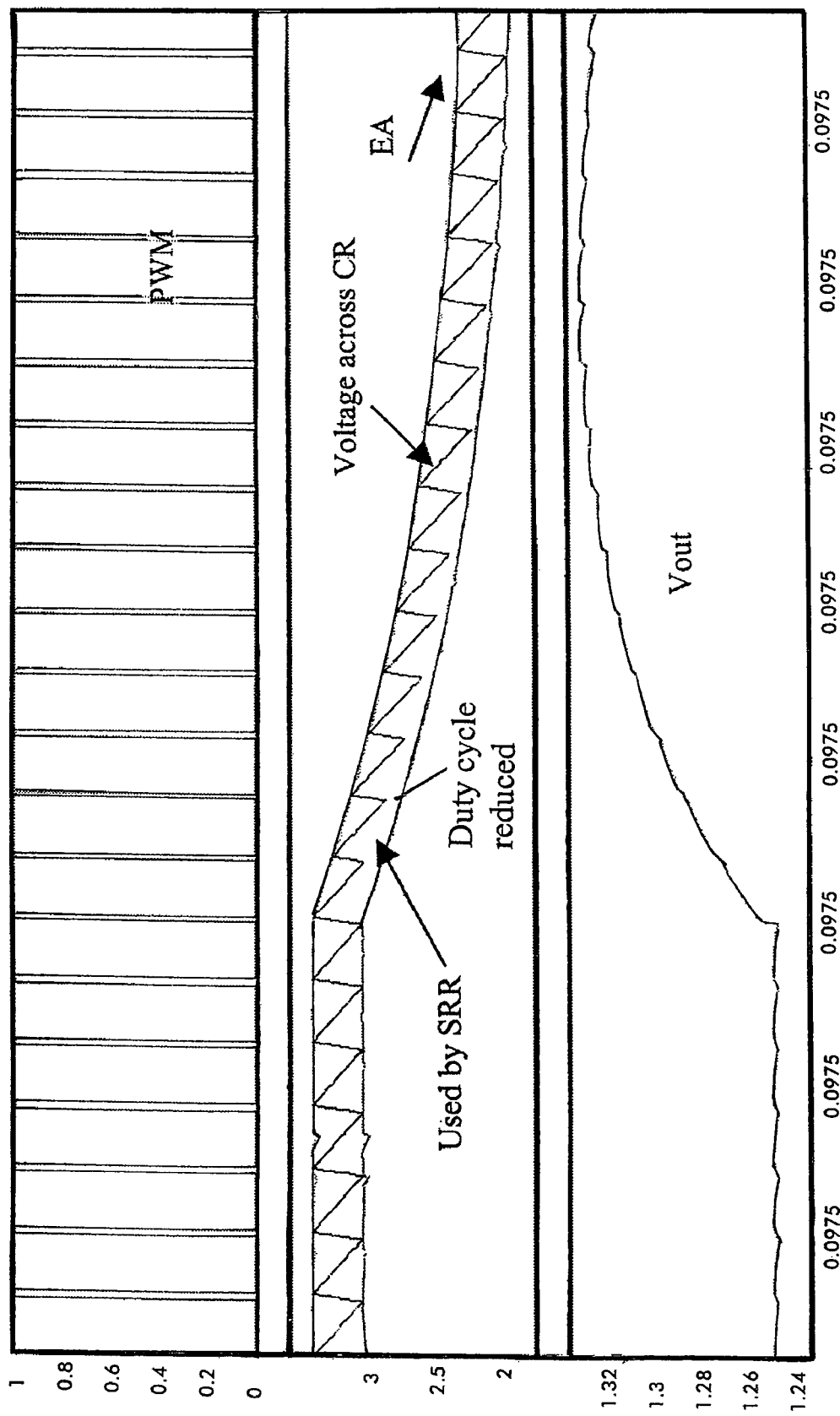
FIG. 4(b) Load step-down

FIXED FREQUENCY RIPPLE REGULATOR

CROSS-REFERENCE TO RELATED APPLICATION

This application is based on and claims priority to U.S. Provisional Patent Application Ser. No. 60/977,484, filed on Oct. 4, 2007 and entitled FIXED FREQUENCY RIPPLE REGULATOR, the entire contents of which are hereby incorporated by reference.

BACKGROUND OF THE INVENTION

The present invention relates to pulse width modulation in power converters, and more specifically to Fixed Frequency Ripple Regulator modulation.

A simplified diagram of a synthetic ripple regulator pulse width modulation (PWM) converter is shown in FIG. 5. In this type of converter, an error amplifier EA provides an error signal to a synthetic ripple regulator (SRR) that provides PWM pulses to drive the output stage comprising transistors $Q_1$ and $Q_2$. These regulators provide a fast response to a load transient. The switching frequency of the converter 5 is not fixed and the converter operates asynchronously.

FIG. 1 shows the SRR. The output of the error amplifier 10 is fed to inputs of hysteresis comparators 40 and 42 to provide reset and set signals to a flip-flop circuit 14. The switching stage 16 includes high and low power transistors Q1 and Q2 connected at a switching node 18, which is coupled to a capacitor 22 through an inductor 20. The power transistors may be MOSFETs and are switched complementarily.

FIG. 1 illustrates the SSR having transconductance amplifiers 30 and 32, which respectively convert the voltages $V_{IN}$ and $V_O$ into currents that charge and discharge a ripple capacitor 34. A transistor Q3, controlled by the PWM signal provided by the flip-flop circuit 14, is coupled between output terminals of the amplifiers 30 and 32.

The positive slope of voltage $V_R$ at node 36 can be written as:

$$V_{RPOS} = g_m \cdot (V_{in} - V_{out})$$

and the negative slope of $V_R$ can be written as:

$$V_{RNEG} = g_m \cdot V_{out},$$

where $g_m$ is the gain of the transconductance amplifiers.

The Synthetic Ripple Regulator of FIG. 1 has comparators 40 and 42. The comparator 40 controls a negative going edge of the PWM signal by providing a resetting signal to the flip-flop circuit 14 when the voltage $V_R$ across the capacitor 34 exceeds the sum of the predefined window voltage value $V_{window}$ (VW) and the error amplifier output signal EA. The comparator 42 controls a positive going edge of the PWM signal by providing a setting signal to the flip-flop circuit 14 when the voltage $V_R$ across the capacitor 34 falls below the level of the error amplifier output signal EA.

FIGS. 3a and 3b illustrate operation of the SSR for a load step up and load step down. The ripple voltage across CR is determined between EA and EA+Vwindow, the window voltage. When the ripple voltage VR drops below EA, the flip-flop 15 is set so the PWM pulse starts. When the ripple voltage exceeds EA+VW, the flip-flop is reset and the PWM pulse terminates. The duty cycle of the PWM pulse is determined by comparing the EA output to the ripple voltage. FIG. 3a shows a load step-up (increased load current) response and FIG. 3b shows a load step-down (decreased load current) response. As illustrated, during the transient, the SRR modulator (see FIG. 1) changes switching frequency to effectively have the desired dynamic duty cycle to compensate output voltage change. Thus, as the output voltage $V_{out}$ decreases in FIG. 3a in response to a load step-up, the duty cycle increases and as the output voltage increases in response to a load step-down, the duty cycle decreases.

While Synthetic Ripple Regulator (SRR) modulation technology claims the fastest response, SRR modulation has inherent shortcomings. Such shortcomings include variable frequency operation and difficulty of implementation in multi-phase applications.

SUMMARY OF THE INVENTION

It is an object of the present invention to provide a converter modulator with a faster transient response from the SRR.

It is another object of the present invention to provide a converter operating with Fixed Frequency pulse width modulation that is easy to implement in single phase as well as multi-phase PWM controllers.

It is yet another object of the present invention to provide a converter modulator with a fixed frequency operation.

It is furthermore an object of the invention to use Fixed Frequency pulse width modulation to make LC output filters resemble a first order system in which the closed loop stability can be achieved with a type II compensation network, making internal integrated compensation possible.

Provided is a ripple regulator for providing a pulse width modulation (PWM) signal for regulating an output voltage of a power converter switching stage. The regulator including a ripple circuit for providing a ripple voltage; a comparison circuit for comparing the ripple voltage to an output of an error amplifier; and a PWM circuit producing the PWM signal and receiving an output of the comparison circuit and a clock signal input, the clock signal input determining a first edge of the PWM signal and the output of said comparison circuit determining a second edge of the PWM signal.

Other features and advantages of the present invention will become apparent from the following description of the invention that refers to the accompanying drawings.

BRIEF DESCRIPTION OF THE DRAWINGS

FIGS. 3a and 3b are graphs showing load step-up and load step-down results simulated with the ripple regulator of FIG. 1;

FIGS. 4a and 4b are graphs showing load step-up and load step-down results simulated with the ripple regulator of FIG. 2.

DETAILED DESCRIPTION OF EMBODIMENTS OF THE INVENTION

Figure 2:
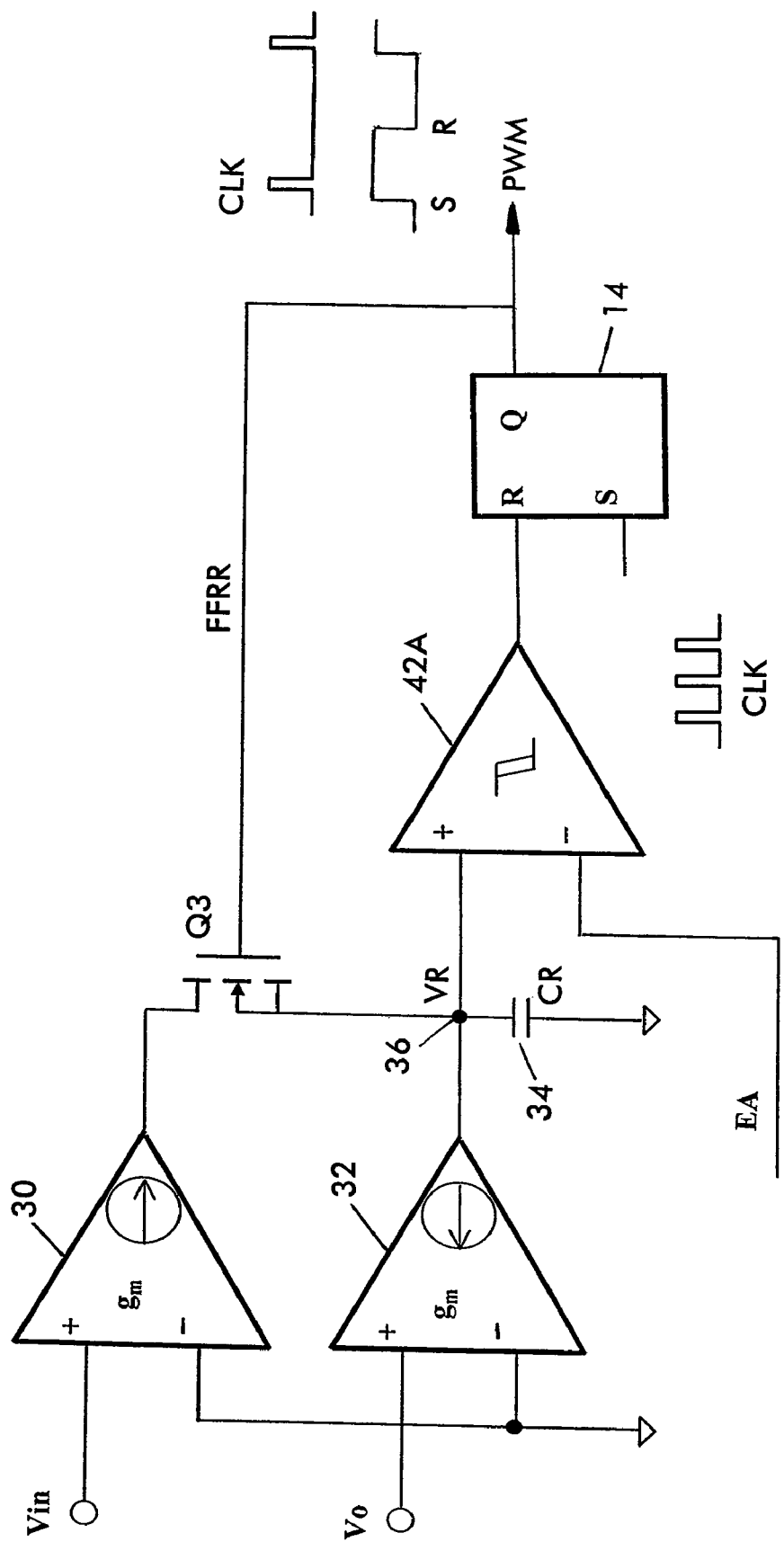
FIG. 2 is a diagram of the Fixed Frequency Ripple Regulator (FFRR) of a preferred embodiment of the invention.
Figure 5:
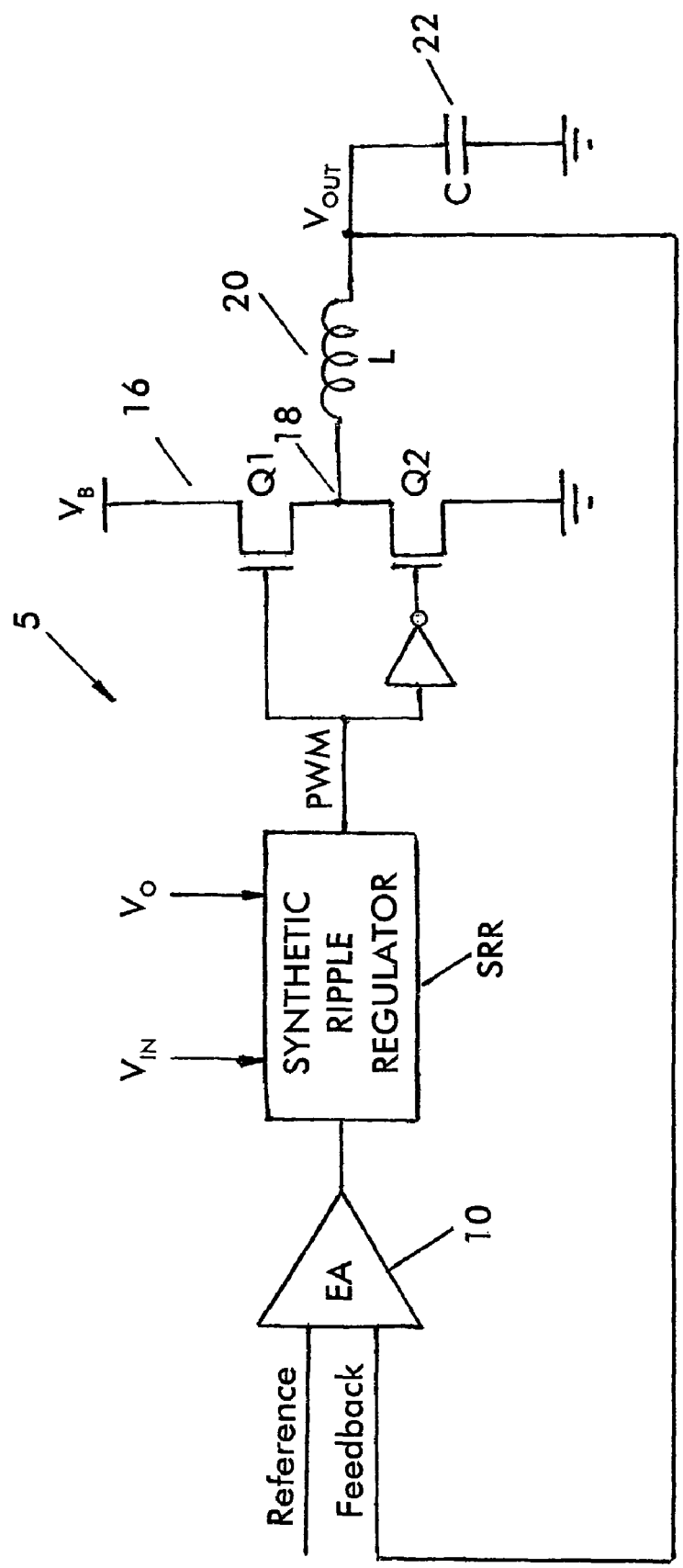
FIG. 5 is a diagram of a prior art Synthetic Ripple Regulator pulse width modulation converter.

FIG. 2 shows the invention, called fixed frequency ripple regulator (FFRR) that is used instead of the SRR. In FIG. 2, the voltage across CR 34 is compared with the error amplifier output by comparator 42A. The PWM starts (sets) with the rising edge of an external clock CLK. The PWM is terminated (reset) when the voltage across CR exceeds the error amplifier output.

In FIG. 2 a comparator 42A controls the negative going edge of the PWM signal by providing a resetting signal to the flip-flop circuit 14 when the voltage $V_R$ across the capacitor 34 reaches the level of the error amplifier output signal EA. The positive going edge of the PWM signal is controlled by setting the flip-flop circuit 14 in response to the external clock signal.

Figure 1:
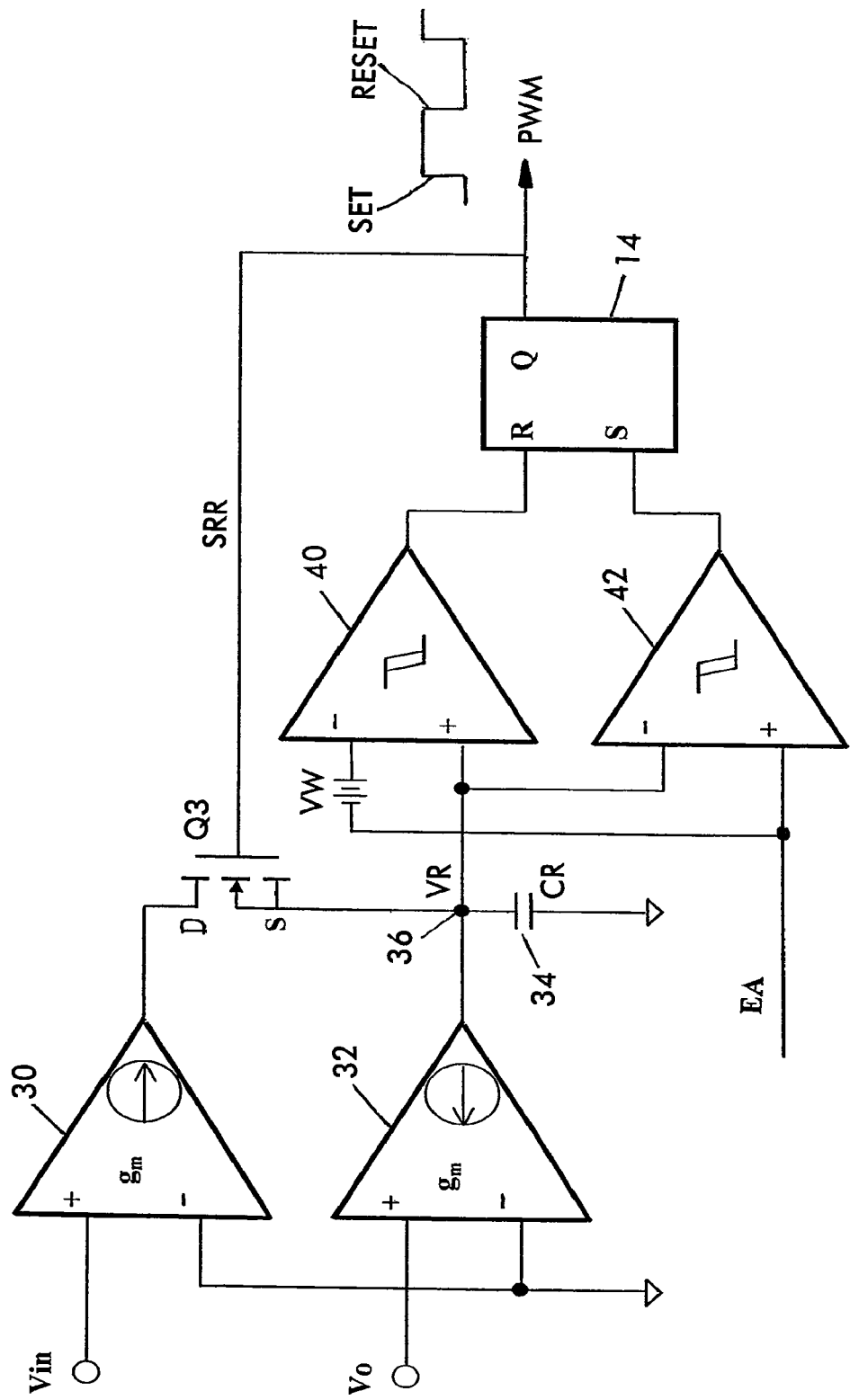
FIG. 1 is a diagram of a prior art Synthetic Ripple Regulator.

The implementation methods of the Fixed Frequency Ripple Regulator can vary. However, the basic concept shown in the FFRR circuit of FIG. 2 is to use an external CLOCK to determine one edge of the PWM pulse. The other edge is determined by the output of comparing the voltage across the ripple capacitor CR to the output of the error amplifier. The PWM frequency is fixed and the PWM is synchronous, in contrast to the SRR of FIG. 1.

FIGS. 4a and 4b show the operation of the invention during a load step-up and load step down. The ripple voltage is shown. The invention shows an improved, faster transient response. In FIG. 4a, for a load step-up, when the output voltage VOUT starts to decrease, the inventive circuit wall respond by increasing the duty cycle of the PWM signal provided to switch Q1. This is shown by the undershoot of the ripple voltage in FIG. 4a. The undershoot is shown versus the lower limit of the window of the prior art SRR circuit. Thus, the duty cycle of the PWM signal is increased beyond the duty cycle of the SRR circuit, resulting in a faster respond to the load step-up.

FIG. 4b shows a load step down. As the voltage VOUT starts to increase, the ripple voltage switches the comparator 42A sooner than the SRR circuit, thereby reducing the duty cycle faster and providing a better response.

In the FFRR circuit of FIG. 2, while the duty cycle is changed, the switching frequency does not change.

Further, in addition to providing a faster transient response and being easy to implement in either single phase or multiphase PWM controllers, the FFRR circuit of FIG. 2 makes the LC output filter resemble a first order system in which the closed loop stability can be achieved with a type II compensation network. This makes it possible for internal integrated compensation.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A ripple regulator for providing a pulse width modulation (PWM) signal for regulating an output voltage of a power converter switching stage, the regulator comprising:
    a ripple circuit for providing a ripple voltage;
    a comparison circuit for comparing the ripple voltage to an output of an error amplifier; and
    a PWM circuit producing the PWM signal and receiving an output of the comparison circuit and an external clock signal input, the external clock signal input determining a first edge of the PWM signal and the output of said comparison circuit determining a second edge of the PWM signal;
    wherein the PWM signal maintains a fixed frequency in response to a load transient.

2. The ripple regulator of claim 1, wherein the error amplifier receives a feedback voltage from the converter output voltage and a reference voltage.

3. The ripple regulator of claim 1, wherein the ripple circuit comprises:
    a capacitor; and
    first and second amplifiers for converting first and second voltages into currents that charge and discharge the capacitor, the first and second amplifiers having respective output terminals.

4. The ripple regulator of claim 3, wherein the ripple circuit further comprises a first transistor coupled between the output terminals of the first and second amplifiers, the first transistor being controlled by the PWM signal provided by the PWM circuit.

5. The ripple regulator of claim 4, wherein the amplifiers are transconductance amplifiers.

6. The ripple regulator of claim 3, wherein the PWM circuit comprises a flip-flop circuit for generating the PWM signal and the output of the error amplifier indicates whether the output voltage should be regulated to increase or decrease.

7. The ripple regulator of claim 6, wherein the PWM circuit is set by an edge of the external clock signal input and reset when the ripple voltage exceeds the output signal of the error amplifier.

8. The ripple regulator of claim 3, wherein a duty cycle of the PWM signal is changed by the falling negative edge of the PWM signal and the fixed frequency in response to the load transient is substantially equal to a steady-state frequency of the PWM signal.

9. The ripple regulator of claim 1, wherein the power converter switching stage includes high and low power transistors connected in series at a switching node.

10. The ripple regulator of claim 9, wherein the power converter switch stage comprises a buck regulator including an inductor coupled between the switching node and an output capacitor.

* * * * *